United States Patent
Choi et al.

(10) Patent No.: US 11,041,913 B2
(45) Date of Patent: Jun. 22, 2021

(54) BATTERY AGING STATE CALCULATION METHOD AND DEVICE

(71) Applicant: LG Chem, Ltd., Seoul (KR)

(72) Inventors: Hae In Choi, Daejeon (KR); Jong Bum Lee, Nonsan-Si (KR)

(73) Assignee: LG Chem, Ltd.

( * ) Notice: Subject to any disclaimer, the term of this patent is extended or adjusted under 35 U.S.C. 154(b) by 832 days.

(21) Appl. No.: 15/799,475

(22) Filed: Oct. 31, 2017

(65) Prior Publication Data

US 2018/0120385 A1     May 3, 2018

(30) Foreign Application Priority Data

Nov. 1, 2016 (KR) .................. 10-2016-0144469

(51) Int. Cl.
    *G01R 31/392* (2019.01)
    *G01R 31/36* (2020.01)
    *G01R 31/374* (2019.01)

(52) U.S. Cl.
    CPC ....... *G01R 31/392* (2019.01); *G01R 31/3648* (2013.01); *G01R 31/374* (2019.01)

(58) Field of Classification Search
    CPC ................ G01R 31/392; G01R 31/367; G01R 31/3648; G01R 31/389; G01R 31/36; G01R 31/374; Y02E 60/12
    See application file for complete search history.

(56) References Cited

U.S. PATENT DOCUMENTS

| | | | |
|---|---|---|---|
| 2006/0181245 A1* | 8/2006 | Mizuno | G01R 31/367 320/132 |
| 2015/0021991 A1* | 1/2015 | Wood | H02J 7/022 307/23 |
| 2015/0268309 A1 | 9/2015 | Kim | |
| 2017/0242077 A1* | 8/2017 | Guo | B60L 58/12 |
| 2018/0074129 A1* | 3/2018 | Nakao | B60L 3/00 |
| 2018/0210036 A1* | 7/2018 | Yamauchi | H01M 10/425 |

FOREIGN PATENT DOCUMENTS

| KR | 20140053585 A | 5/2014 |
|---|---|---|
| KR | 20150109643 A | 10/2015 |
| KR | 2016-27718 A | 3/2016 |

* cited by examiner

*Primary Examiner* — Janet L Suglo
(74) *Attorney, Agent, or Firm* — Lerner, David, Littenberg, Krumholz & Mentlik, LLP

(57) ABSTRACT

The present disclosure relates to a battery aging state calculation method and device, and more particularly, to a battery aging state calculation method and device for calculating a (i.e., State of Health (SOH)) according to each execution operation and calculating a final battery SOH based on charge/discharge execution counts to improve the accuracy of the battery SOH.

10 Claims, 2 Drawing Sheets

BATTERY AGING STATE CALCULATION METHOD AND DEVICE

CROSS-REFERENCE TO RELATED APPLICATION

This application claims priority to Korean Patent Application No. 10-2016-0144469 filed on Nov. 1, 2016 and all the benefits accruing therefrom under 35 U.S.C. § 119, the contents of which are incorporated by reference in their entirety.

BACKGROUND

The present disclosure relates to a battery aging state calculation method and device, and more particularly, to a battery aging state calculation method and device for calculating a (i.e., State of Health (SOH)) according to each execution operation and calculating a final battery SOH based on charge/discharge execution counts to improve the accuracy of the battery SOH In general, a plurality of unit secondary battery cells are assembled in a typical battery, and a battery management system (BMS) is configured therein to efficiently control charge or discharge of the battery.

When charge or discharge is repeated in the battery, the chemical materials inside the battery undergo chemical degenerations, or the electrical structures or the mechanical characteristics are deformed, so that the battery is aged. Also, if the aging process is continued, the lifetime of the battery will be lowered gradually compared to the initial lifetime, and will be shortened at the end.

Therefore, in many systems using a battery, since it is very important for the stable operation of the system to estimate the function degradation and when to replace the battery due to aging, the maintenance of the remaining battery lifetime is necessary, and to this end, accurate battery lifetime prediction is very important.

This lifetime prediction is an aging state (e.g., State of Health (SOH)), which is a value estimated from the BMS and also estimated using Equation 1.

$$\text{SOH} = (\int i\, dt)/(\text{SOC} \times \text{Nominal Capacity}) \quad \text{(Equation 1)}$$

Here, a State of Charge (SOC) means a change amount of battery charge state. An SOC is estimated based on voltage, current, and temperature, and then, a difference with an initial SOC is obtained to calculate it as the SOC.

In addition, Nominal Capacity is the amount of current normally available at room temperature, and $\int i\, dt$ is the integrated amount of current for a predetermined time.

However, when an SOH is estimated after charge or discharge is unidirectional, the accuracy of an SOH estimation value is degraded when a current sensor for measuring current has an offset.

Here, the offset refers to a value that must be added or subtracted from the current value measured by the actual current sensor in order to calibrate the zero point of the current sensor which measures the current outputted from a high voltage battery mounted on a hybrid vehicle or the like as in adjusting the zero point of a scale.

For example, if the current sensor has a (+) offset, the charge SOH is estimated to be higher than the original value, and the discharge SOH is estimated to be lower than the original value.

In addition, if the current sensor has a (−) offset, the charge SOH is estimated to be lower than the original value, and the discharge SOH is estimated to be higher than the original value.

Therefore, conventionally, the SOH values for charge and discharge are respectively estimated, and the estimated SOH values are averaged to calculate the final SOH value.

However, this method has an error when the charges and discharge counts are not the same.

For example, in the case that the current sensor has a (+) offset, if the ratio of charge to discharge is 1:2, the discharge SOH value is estimated to be lower than the original value, so the final SOH value is calculated to be lower than the original final SOH value.

Therefore, it is required to develop a technique that can more accurately calculate the final SOH value considering the offset and the charge/discharge counts of the current sensor.

PRIOR ART DOCUMENTS

Patent Documents (Patent Document 1) KR10-2016-0027718 A

SUMMARY

The present disclosure provides a battery aging state calculation method and device capable of calculating a more accurate final SOH value by reflecting the charge/discharge counts.

In accordance with an exemplary embodiment, a method of calculating an aging state (i.e., State of Health (SOH)) of a battery includes: a measurement operation for measuring a current, a voltage, and a temperature at an execution start and end time for each charge and discharge operation during a charge and discharge operation execution in a target battery for a predetermined time; a State of Charge (SOC) change amount estimation operation for estimating a change amount of an SOC at a start and end time point of each of the charge and discharge operation based on the current, voltage, and temperature measured in the measurement operation; an SOH calculation operation for calculating an SOH according to each charge and discharge operation based on each SOC change amount calculated in the SOC change amount calculation operation; and an final SOH calculation operation for calculating a final SOH by applying a weight according to a charge and discharge count to each SOH calculated in the SOH calculation operation.

The measurement operation may further include: a charge current integration operation for integrating a current charged during a charge execution; and a discharge current integration operation for integrating a current discharged during a discharge execution.

The SOH calculation operation may include: a charge SOH calculation operation for calculating an SOH value during a charge execution by using a pre-stored nominal capacity, a charge current amount integrated in the charge current integration operation, and an SOC change amount calculated in the SOC change amount estimation operation during a charge execution; and a discharge SOH calculation operation for calculating an SOH value during a discharge execution by using a pre-stored nominal capacity, a discharge current amount integrated in the discharge current integration operation, and an SOC change amount calculated in the SOC change amount estimation operation during a discharge execution.

When charge/discharge occurs at the same time, the final SOH calculation operation may classify as a charge or discharge state according to a sign of the SOC change amount calculated in the SOC change amount calculation operation.

When an SOC change amount calculated in the SOC change amount calculation operation is a negative number, the SOH calculation operation may convert the negative number into a positive number to calculate an SOH.

In accordance with another exemplary embodiment, a device for calculating an aging state (i.e., State of Health (SOH)) of a battery includes: a measurement unit for measuring a current, a voltage, and a temperature at an execution start and end time for each charge and discharge operation during a charge and discharge execution in a target battery for a predetermined time; a State of Charge (SOC) estimation unit for estimating an SOC at an execution start and end time for each charge and discharge operation based on the current, voltage, and temperature measured in the measurement unit; an SOC change amount calculation unit for calculating a change amount of SOC according to each charge and discharge operation estimated by the SOC estimation unit; an SOH calculation unit for calculating an SOH of each charge and discharge operation based on each SOC change amount calculated in the SOC change amount calculation unit; and a final SOH calculation unit for calculating a final SOH by applying a weight according to a charge and discharge count to each SOH calculated in the final SOH calculation unit.

The measurement unit may further include: a charge current integration unit for integrating a current charged during a charge execution; and a discharge current integration unit for integrating a current discharged during a discharge execution.

The SOH calculation unit may include: a charge SOH calculation unit for calculating an SOH value during a charge execution by using a pre-stored nominal capacity, a charge current amount integrated in the charge current integration unit, and an SOC change amount calculated in the SOC change amount estimation unit during a charge execution; and a discharge SOH calculation unit for calculating an SOH value during a discharge execution by using a pre-stored nominal capacity, a discharge current amount integrated in the discharge current integration unit, and an SOC change amount calculated in the SOC change amount estimation unit during a discharge execution.

When charge/discharge occurs at the same time, the SOH calculation unit may classify as a charge or discharge state according to a sign of the SOC change amount calculated in the SOC change amount calculation unit.

When an SOC change amount calculated in the SOC change amount calculation unit is a negative number, the SOH calculation unit may convert the negative number into a positive number to calculate an SOH.

BRIEF DESCRIPTION OF THE DRAWINGS

Exemplary embodiments can be understood in more detail from the following description taken in conjunction with the accompanying drawings, in which.

DETAILED DESCRIPTION OF EMBODIMENTS

Hereinafter, exemplary embodiments of the present invention will be described in more detail with reference to the contents described in the accompanying drawings. However, the present invention is not limited or restricted to exemplary embodiments. Only, the technical spirit of the inventive concept is disclosed to the full through the description of the embodiments, and it is provided to those skilled in the art that the inventive concept belongs to inform the scope of the inventive concept completely.

Although the terms "first," "second," etc., may be used herein to describe various elements, these elements should not be limited by these terms. The above terms are used only to distinguish one component from another. For example, a first component may be referred to as a second component and vice versa without departing from the scope of the present invention. Terms used in this specification are used to describe specific embodiments, and are not intended to limit the scope of the present invention. The singular expressions include plural expressions unless the context clearly dictates otherwise.

Terms used in this specification may be currently widely used general terms in consideration of functions in the present invention but may vary according to the intents of those skilled in the art, precedents, or the advent of new technology. Additionally, in certain cases, there may be terms the applicant selects arbitrarily and in this case, their meanings are described in a corresponding description part of the present invention. Accordingly, terms used in the present invention should be defined based on the meaning of the term and the entire contents of the present invention instead of the simple term name 1. Battery aging state calculation method according to embodiment of the present disclosure.

The battery aging state calculation method of the present disclosure is a method of accurately calculating the aging state of a battery by calculating a state of charge (SOC) by measuring a current, a voltage and a temperature during a discharge or charge execution and calculating a final SOH based on the SOH for each execution.

Figure 1:
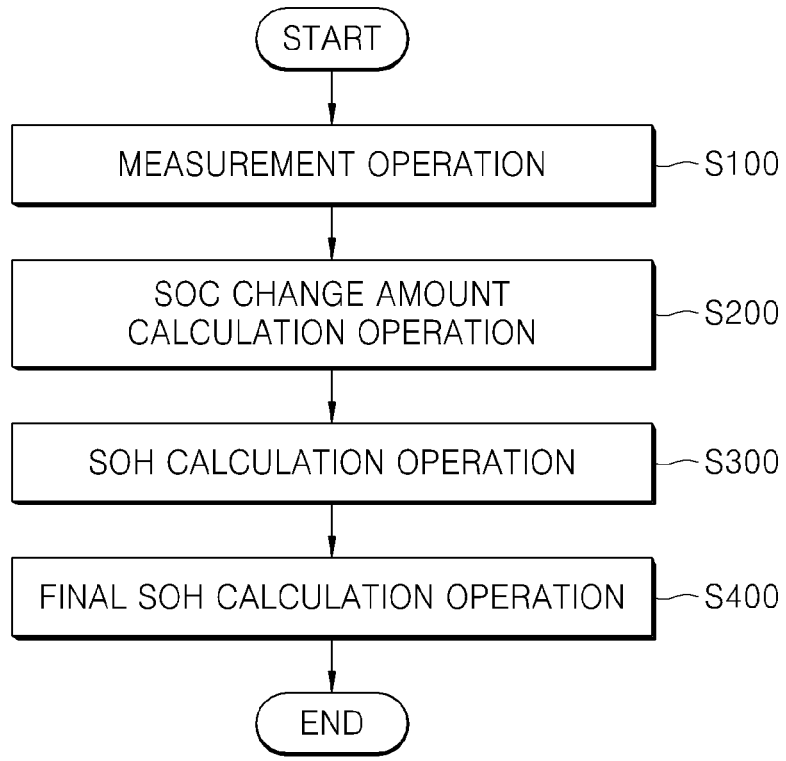
FIG. 1 is a flowchart of a battery aging state calculation method according to an embodiment of the present disclosure.

FIG. 1 is a flowchart of a battery aging state calculation method according to an embodiment of the present disclosure.

Referring to FIG. 1, a battery aging state calculation method according to an embodiment of the present disclosure measures a current, a voltage, and a temperature during a charge and a discharge execution in a target battery for a predetermined time (measurement operation: S100).

Meanwhile, a change amount of SOC in each execution operation is calculated based on the current, voltage, and temperature measured in the measurement operation S100 (SOC change amount calculation operation: S200).

An SOH according to individual charge and discharge operations is calculated using each SOC change amount calculated in the SOC change amount calculation operation (S200), a pre-stored nominal capacity, and a current measured individually in the measurement operation (SOH calculation operation: S300).

A final SOH is calculated with a weight according to a charge and discharge count on each SOH calculated in the SOH calculation operation (S300) (final SOH calculation operation: S400).

Here, the predetermined time is a preset time for calculating the final SOH regularly. If charge or discharge occurs only once during a predetermined time, since there is no need to assign a weight according to a charge and discharge count, execution is made except for the final SOH calculation operation (S400).

Also, the pre-stored nominal capacity, as the amount of current that can be used by the battery at room temperature, is an original property value of the battery and thus, is pre-stored and used.

The measurement operation S100 further includes a charge current integration operation for integrating the charged current during the charge execution and a discharge current integration operation for integrating the discharged current during the discharge execution to prepare a necessary value for the SOH calculation.

If the SOC change amount calculated in the SOC change amount calculation operation (S200) is a negative value, the SOH calculation operation (S300) converts the negative value into a positive number to calculate the SOH. That is, in the case of the SOC change amount of the discharge state, when the SOH calculation is performed, the sign is converted into a positive number so that the accurate final SOH can be calculated according to the weight during the final SOH calculation.

Moreover, the SOC change amount calculation operation (S200) will be described in detail below.

By using a lookup table or a function determined according to a current, a voltage, and a temperature, an SOC in the SOC change amount calculation operation (S200) calculates an initial SOC and an SOC at the time point that charge/discharge ends or the current time.

Therefore, the SOC change amount is calculated by subtracting the initial SOC from the SOC at the time point that charge/discharge ends or the current time.

For example, SOC change amount=(SOC at the time point that charge/discharge ends or the current time)−(initial SOC).

Herein, if charge/discharge occurs at the same time, the value is classified according to the change amount of the SOC. If the SOC change amount is positive, it is classified as a charge state. If the SOC change amount is negative, it is classified as a discharge state.

Also, when calculating using a function, errors occur according to a temperature, so the calculation is performed in consideration of an error range depending on the temperature.

Also, the initial SOC means an SOC at the time point that each charge or discharge starts.

Also, the SOC of the current time means calculating an SOC during a charge or discharge execution because the predetermined time for calculating a battery aging state can calculate a battery aging state during a charge or discharge execution.

Hereinafter, the SOH calculation operation (S300) will be described in more detail with reference to FIG. 2.

Figure 2:
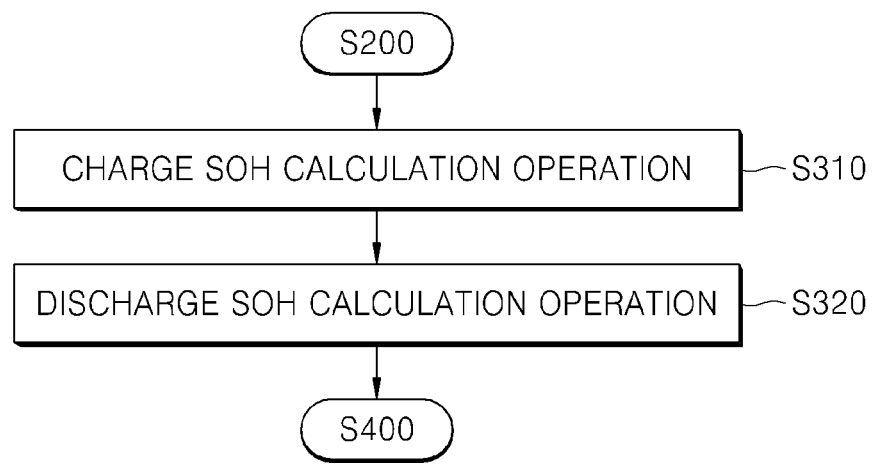
FIG. 2 is a flowchart of an SOH calculation operation in a battery aging state calculation method according to an embodiment of the present disclosure.

FIG. 2 is a flowchart of an SOH calculation operation in a battery aging state calculation method according to an embodiment of the present disclosure.

Referring to FIG. 2, the SOH calculation operation (S300) calculates an SOH value during a charge execution (charge SOH calculation operation: S310) by using a pre-stored nominal capacity, a charge current amount integrated in the charge current integration operation, and an SOC change amount calculated in the SOC change amount calculation operation (S200) during a charge execution, and calculates an SOH value calculated during a discharge execution (discharge SOH calculation operation: S320) by using a pre-stored nominal capacity, a discharge current amount integrated in the discharge current integration operation, and an SOC change amount calculated in the SOC change amount calculation operation (S200) during a discharge execution.

Here, the SOH value is calculated using Equation 1 above.

Furthermore, a method of calculating a final SOH with a weight according to a charge and discharge count in the final SOH calculation operation (S400) will be described below with reference to an example.

If a charge and discharge count ratio is 1:2, the weight of charge SOH is ⅔ and the weight of discharge SOH is ⅓.

Therefore, the final SOH (%)=90*(⅔)+((60+50)/2)*(⅓) when the charge SOH is 90(%) and the discharge SOH is 60(%) and 50(%) so that the final SOH is calculated as 78.3(%).

Accordingly, when the offset of the current sensor is positive and the charge and the discharge count ratio is 1:2, in the conventional method, the accuracy of the final SOH value calculated to be lower than the original value can be improved by the above method.

2. Battery aging state calculation device according to embodiment of present disclosure A battery aging state calculation device of the present disclosure calculates an SOH according to each execution operation after a predetermined time during which charge and discharge are executed and gives a weight for each execution operation so as to calculate the final SOH accurately.

Figure 3:
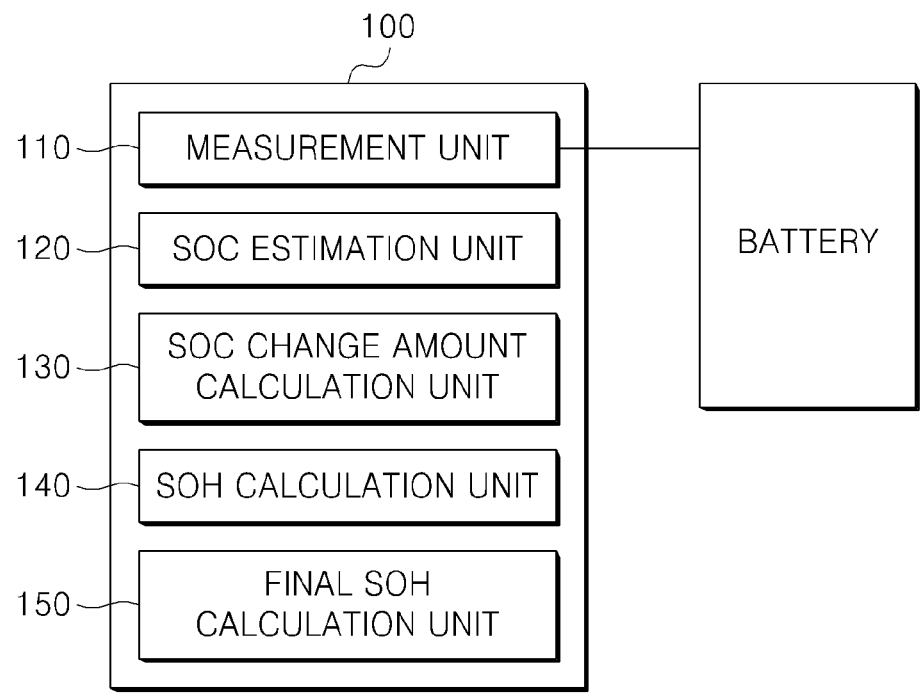
FIG. 3 is a block diagram of a battery aging state calculation device according to an embodiment of the present disclosure.

FIG. 3 is a block diagram of a battery aging state calculation device according to an embodiment of the present disclosure.

Referring to FIG. 3, a battery aging state calculation device 100 according to an embodiment of the present disclosure includes a measurement unit 110 for measuring a current, a voltage, and a temperature at an execution start and end time for each charge and discharge operation during a charge and discharge operation execution in a target battery for a predetermined time, an SOC estimation unit 120 for estimating an SOC at an execution start and end time for each execution operation based on the current, voltage, and temperature measured in the measurement unit 110, an SOC change amount calculation unit 130 for calculating a change amount of SOC according to each execution operation estimated by the SOC estimation unit 120, an SOH calculation unit 140 for calculating an SOH according to each execution operation using the SOC change amount calculated in the SOC change amount calculation unit 130, a stored nominal capacity, and a current separately measured in the measurement unit 110, and a final SOH calculation unit 150 for calculating a final SOH by assigning weights according to charge and discharge counts to respective SOHs calculated in the SOH calculation unit 130.

Here, the battery aging state calculation device 100 is configured in the BMS and is controlled by the MCU in the BMS.

In addition, the predetermined time is a time for regularly calculating the SOH, and If charge or discharge occurs only once during a predetermined time, controls not to execute the final SOH calculation in the SOH calculation unit 140.

Therefore, the battery aging state calculation device 100 is provided with a separate counting unit (not shown) for counting charges and discharges.

Herein, if charge/discharge occurs at the same time, the counting unit (not shown) classifies values according to the change amount of the SOC. If the SOC change amount is positive, it is classified as a charge state. If the SOC change amount is negative, it is classified as a discharge state.

In addition, the measurement unit 110 further includes a charge current integration unit (not shown) for integrating the charged current during the charge execution and a discharge current integration unit (not shown) for integrating the discharged current during the discharge execution to prepare a necessary value for the SOH calculation.

Furthermore, if the SOC change amount calculated in the SOC change amount calculation unit 130 is a negative value, the SOH calculation unit 140 converts the negative value into a positive number to calculate the SOH. That is, in the case of the SOC change amount of the discharge state, when the SOH calculation is performed, the sign is converted into a positive number so that the accurate final SOH can be calculated according to the weight during the final SOH calculation.

Also, the pre-stored nominal capacity, as the amount of current that can be used by the battery at room temperature, is a general value of the battery and thus, is pre-stored and used.

Moreover, the SOC estimation unit 120 and the SOC change amount calculation unit 130 will be described in detail below.

By using a lookup table or a function determined according to a current, a voltage, and a temperature, an SOC in the SOC estimation unit 120 calculates an SOC at the time point that charge/discharge ends or the current time.

Therefore, the SOC change amount is calculated by subtracting the initial SOC from the SOC at the time point that charge/discharge ends or the current time.

Also, the initial SOC means an SOC at the time point that each charge or discharge starts.

Also, the SOC of the current time means calculating an SOC during a charge or discharge execution because the predetermined time for calculating a battery aging state can calculate a battery aging state during a charge or discharge execution.

Hereinafter, the SOH calculation unit 140 will be described below in more detail with reference to FIG. 4.

Figure 4:
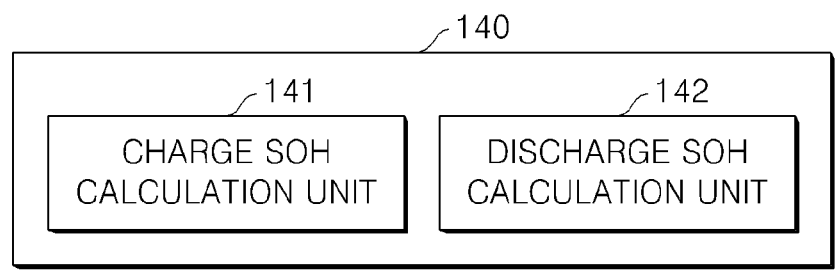
FIG. 4 is a block diagram of an SOH calculation unit in a battery aging state calculation device according to an embodiment of the present disclosure.

FIG. 4 is a block diagram of an SOH calculation unit in a battery aging state calculation device according to an embodiment of the present disclosure.

Referring to FIG. 4, the SOH calculation unit 140 includes a charge SOH calculation unit 141 for calculating an SOH value during a charge execution by using a pre-stored nominal capacity, a charge current amount integrated in the charge current integration unit (not shown), and an SOC change amount calculated in the SOC change amount calculation unit 130 during a charge execution, and a discharge SOH calculation unit 142 for calculating an SOH value calculated during a discharge execution by using a pre-stored nominal capacity, a discharge current amount integrated in the discharge current integration unit (not shown), and an SOC change amount calculated in the SOC change amount calculation unit 130 during a discharge execution.

Here, the SOH value is calculated using Equation 1 above.

The final SOH calculation unit 150, which calculates the final SOH using the calculated charge and discharge SOH, is described in detail below.

The final SOH calculation unit 150 further includes a weight calculation unit (not shown) for calculating a weight according to charges and discharges counted by the counting unit (not shown).

For example, if the ratio of charges and discharges counted by the counting unit (not shown) is 1:2, the weight calculation unit (not shown) calculates a weight for the charge SOH as ⅔ and a weight for the discharge SOH as ⅓.

Thus, the final SOH calculation unit 150 adds a value obtained by multiplying the weight of the charge SOH calculated in the weight calculation unit (not shown) as calculating the average of the charge SOH and a value obtained by multiplying the weight of the discharge SOH calculated in the weight calculation unit (not shown) as calculating the average of the discharge SOH to calculate the final SOH.

The battery aging state calculation method and device according to an embodiment of the present disclosure may calculate the aging state of the battery more accurately by calculating each SOH according to charge and discharge and reflecting a charge and discharge count to calculate a final SOH.

Although the battery aging state calculation method and device have been described with reference to the specific embodiments, they are not limited thereto. Therefore, it will be readily understood by those skilled in the art that various modifications and changes can be made thereto without departing from the spirit and scope of the present disclosure defined by the appended claims.

What is claimed is:

1. A method of calculating an aging state (i.e., State of Health (SOH)) of a battery, the method comprising:
a measurement operation for measuring a current, a voltage, and a temperature at an execution start and end time for each charge and discharge operation during a charge and discharge operation execution in a target battery for a predetermined time;
a State of Charge (SOC) change amount estimation operation for estimating a change amount of an SOC at a start and end time point of each of the charge and discharge operation based on the current, voltage, and temperature measured in the measurement operation;
an SOH calculation operation for calculating an SOH according to each charge and discharge operation based on an absolute value of the SOC change amount calculated in the SOC change amount calculation operation of each of the charge and discharge operation, wherein when an SOC change amount calculated in the SOC change amount estimation operation is a negative number, the SOH calculation operation converts the negative number into a positive number to calculate the SOH; and
an final SOH calculation operation for calculating a final SOH by applying a weight according to a charge and discharge count to each SOH calculated in the SOH calculation operation.

2. The method of claim 1, wherein the measurement operation further comprises:
a charge current integration operation for integrating a current charged during a charge execution; and
a discharge current integration operation for integrating a current discharged during a discharge execution.

3. The method of claim 2, wherein the SOH calculation operation comprises:
- a charge SOH calculation operation for calculating an SOH value during a charge execution by using a pre-stored nominal capacity, a charge current amount integrated in the charge current integration operation, and an SOC change amount calculated in the SOC change amount estimation operation during a charge execution; and
- a discharge SOH calculation operation for calculating an SOH value during a discharge execution by using a pre-stored nominal capacity, a discharge current amount integrated in the discharge current integration operation, and an SOC change amount calculated in the SOC change amount estimation operation during a discharge execution.

4. The method of claim 1, wherein when charge/discharge occurs at a same time, the final SOH calculation operation classifies as a charge or discharge state according to a sign of the SOC change amount calculated in the SOC change amount calculation operation.

5. A device for calculating an aging state (i.e., State of Health (SOH)) of a battery, the device comprising:
- a measurement unit for measuring a current, a voltage, and a temperature at an execution start and end time for each charge and discharge operation during a charge and discharge execution in a target battery for a predetermined time;
- a State of Charge (SOC) estimation unit for estimating an SOC at an execution start and end time for each charge and discharge operation based on the current, voltage, and temperature measured in the measurement unit;
- an SOC change amount calculation unit for calculating a change amount of SOC according to each charge and discharge operation estimated by the SOC estimation unit;
- an SOH calculation unit for calculating an SOH of each charge and discharge operation based on an absolute value of the SOC change amount calculated in the SOC change amount calculation unit for each charge and discharge operation; and
- a final SOH calculation unit for calculating a final SOH by applying a weight according to a charge and discharge count to each SOH calculated in the SOH calculation unit.

6. The device of claim 5, wherein the measurement unit further comprises:
- a charge current integration unit for integrating a current charged during a charge execution; and
- a discharge current integration unit for integrating a current discharged during a discharge execution.

7. The device of claim 6, wherein the SOH calculation unit comprises:
- a charge SOH calculation unit for calculating an SOH value during a charge execution by using a pre-stored nominal capacity, a charge current amount integrated in the charge current integration unit, and an SOC change amount calculated in the SOC estimation unit during a charge execution; and
- a discharge SOH calculation unit for calculating an SOH value during a discharge execution by using a pre-stored nominal capacity, a discharge current amount integrated in the discharge current integration unit, and an SOC change amount calculated in the SOC estimation unit during a discharge execution.

8. The device of claim 5, wherein when charge/discharge occurs at a same time, the final SOH calculation unit classifies as a charge or discharge state according to a sign of the SOC change amount calculated in the SOC change amount calculation unit.

9. A method of estimating a remaining battery lifetime, the method comprising:
- a measurement operation for measuring a current, a voltage, and a temperature at an execution start and end time for each charge and discharge operation during a charge and discharge operation execution in a target battery for a predetermined time;
- a State of Charge (SOC) change amount estimation operation for estimating a change amount of an SOC at a start and end time point of each of the charge and discharge operation based on the current, voltage, and temperature measured in the measurement operation;
- a battery lifetime estimation operation for calculating an estimated battery lifetime according to each charge and discharge operation based on each SOC change amount calculated in the SOC change amount calculation operation; and
- an final battery lifetime estimation operation for estimating a final SOH by applying a weight according to a charge and discharge count to each estimated battery lifetime calculated in the battery lifetime estimation operation.

10. The method of claim 9, further comprising a current integration operation for calculating an integrated charged current during the charge operation and an integrated discharged current during the discharge operation, wherein the estimated battery lifetime according to the charge operation is based further on the integrated charged current, and wherein the estimated battery lifetime according to the discharge operation is based further on the integrated discharged current.

* * * * *